United States Patent
Sung et al.

(10) Patent No.: US 11,297,731 B2
(45) Date of Patent: Apr. 5, 2022

(54) ASSEMBLED AIR SHROUD

(71) Applicants: Inventec (Pudong) Technology Corporation, Shanghai (CN); INVENTEC CORPORATION, Taipei (TW)

(72) Inventors: Tai-Jung Sung, Taipei (TW); Yi-Hsin Chen, Taipei (TW)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 264 days.

(21) Appl. No.: 16/684,603

(22) Filed: Nov. 15, 2019

(65) Prior Publication Data

US 2021/0076532 A1 Mar. 11, 2021

(30) Foreign Application Priority Data

Sep. 6, 2019 (CN) .......................... 201910844538.3

(51) Int. Cl.
*H05K 7/20* (2006.01)
*F16B 5/00* (2006.01)
(Continued)

(52) U.S. Cl.
CPC ........ *H05K 7/20009* (2013.01); *F16B 5/0036* (2013.01); *F16B 5/121* (2013.01);
(Continued)

(58) Field of Classification Search
CPC ...... H05K 7/1404; H05K 7/1405; H05K 7/18; H05K 7/20; H05K 7/20009; H05K 7/20127; H05K 7/20136; H05K 7/20145; H05K 7/202; H05K 7/20436; H05K 7/20545; H05K 5/00; H05K 5/0013; H05K 5/0217; H05K 5/0047; H05K 5/0004; H05K 5/0052; H05K 5/0221; F16B 5/00; F16B 5/008;
(Continued)

(56) References Cited

U.S. PATENT DOCUMENTS 3,399,916 A * 9/1968 Ensor ...................... E04D 3/365
52/588.1
3,420,028 A * 1/1969 Barker .................... F16B 5/008
52/588.1
(Continued)

FOREIGN PATENT DOCUMENTS

DE 3724648 A1 * 2/1989 ............... B65D 7/34
WO WO-2018047579 A1 * 3/2018 ............... F16B 21/08

OTHER PUBLICATIONS

Machine Translation of Scheible (Year: 1989).*
Machine Translation of Ichiki (Year: 2018).*

*Primary Examiner* — Michael G Hoang
*Assistant Examiner* — Mark P Yost
(74) *Attorney, Agent, or Firm* — CKC & Partners Co., LLC

(57) ABSTRACT

An assembled air shroud includes a first plate and a second plate. The first plate has a first engaging portion, and the second plate has a second engaging portion facing the first engaging portion. The first plate and the second plate are arranged along a first axis, and the first engaging portion and the second engaging portion are detachably engaged along a second axis different from the first axis.

6 Claims, 8 Drawing Sheets

(51) Int. Cl.
*F16B 5/12* (2006.01)
*G06F 1/20* (2006.01)

(52) U.S. Cl.
CPC ............... *F16B 5/126* (2013.01); *G06F 1/20* (2013.01); *H05K 7/20145* (2013.01)

(58) Field of Classification Search
CPC .... F16B 5/0016; F16B 5/0004; F16B 5/0036; F16B 5/0056; F16B 5/07; F16B 5/121; F16B 5/126; F16B 17/008; G06F 1/182; G06F 1/20
USPC ......................................................... 454/184
See application file for complete search history.

(56) References Cited

U.S. PATENT DOCUMENTS

| | | | | |
|---|---|---|---|---|
| 3,969,866 | A * | 7/1976 | Kyne | F16B 5/0664 52/588.1 |
| 5,042,220 | A * | 8/1991 | Jackson | E04F 19/02 52/717.01 |
| 5,052,158 | A * | 10/1991 | D'Luzansky | F16B 17/008 52/177 |
| 7,310,228 | B2 * | 12/2007 | Chen | H05K 7/20154 165/104.33 |
| 7,355,562 | B2 * | 4/2008 | Schubert | G09F 9/3026 345/1.3 |
| 7,408,773 | B2 * | 8/2008 | Wobig | G06F 1/20 165/104.33 |
| 2003/0082986 | A1 * | 5/2003 | Wiens | A63H 33/062 446/120 |
| 2010/0218450 | A1 * | 9/2010 | Braun | F16B 5/0056 52/588.1 |
| 2012/0027511 | A1 * | 2/2012 | Wei | H05K 5/0013 403/381 |
| 2014/0133087 | A1 * | 5/2014 | Chen | H05K 7/20727 361/679.33 |
| 2014/0311832 | A1 * | 10/2014 | Manner | F16B 5/0088 187/401 |
| 2018/0001840 | A1 * | 1/2018 | Talebpour | B60R 13/0206 |
| 2019/0061937 | A1 * | 2/2019 | Schafer | B64C 39/022 |

* cited by examiner

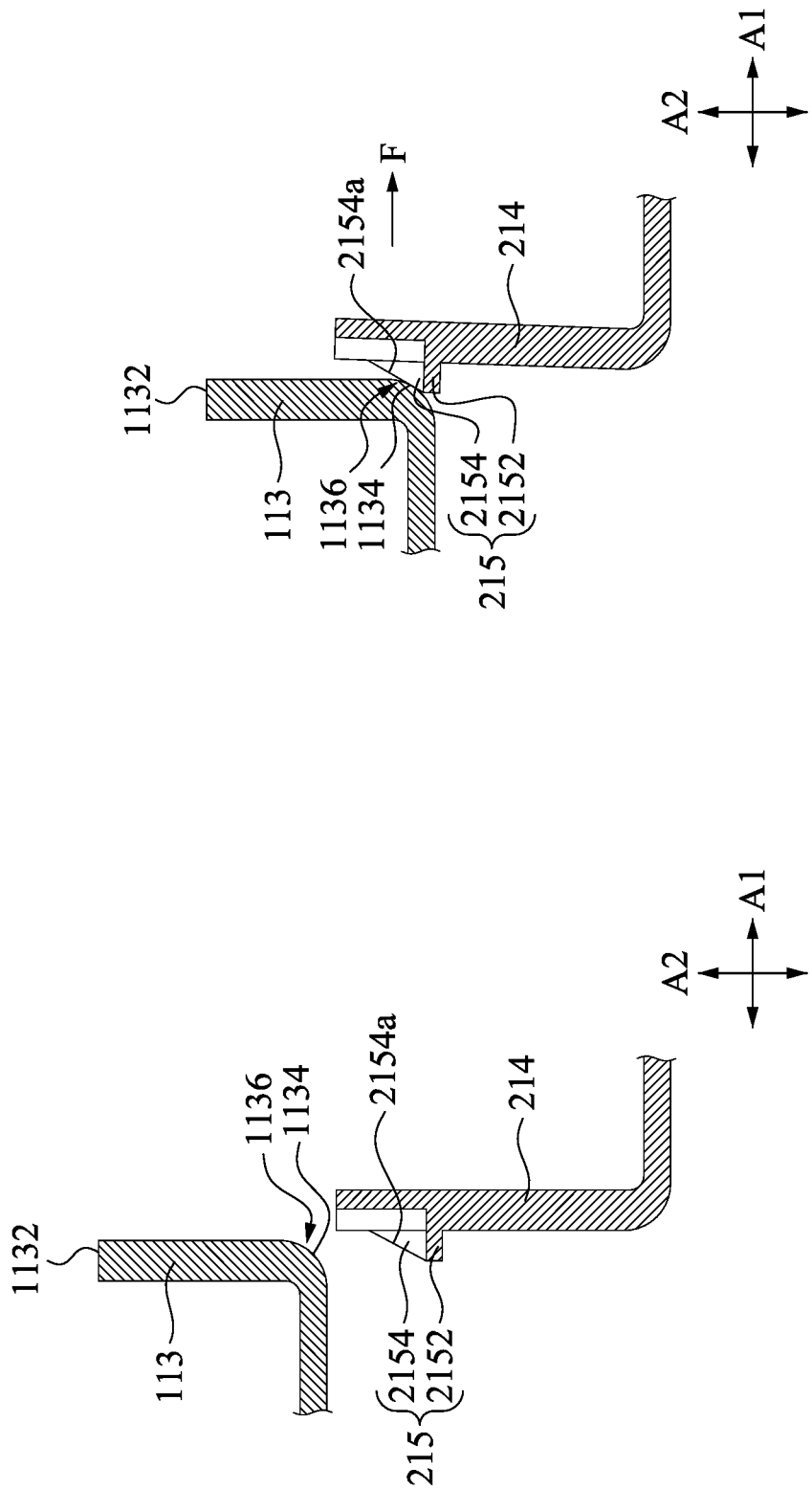

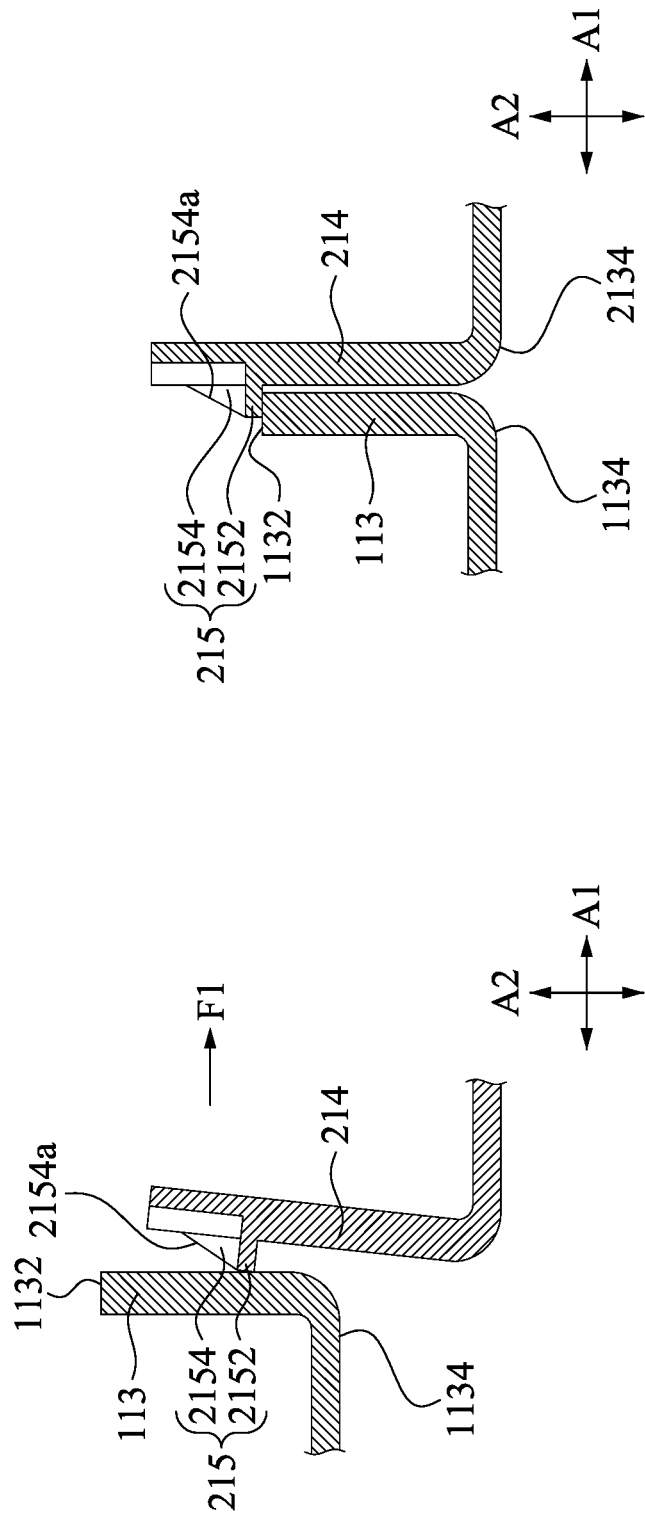

ASSEMBLED AIR SHROUD

CROSS-REFERENCE TO RELATED APPLICATION

This application claims priority to China Application Serial Number 201910844538.3, filed Sep. 6, 2019 which is herein incorporated by reference in its entirety.

BACKGROUND

Field of Invention

The present invention relates to an air shroud. More particularly, the present invention relates to an assembled air shroud.

Description of Related Art

The air shrouds are usually designed as one piece concerning the strength and the convenience of assembling. Therefore, users need to unplug all the cables when they are going to exchange the memory cards underlying the air shrouds, such that the air shroud can be lifted and the memory cards can be exchanged. However, the process of plug and unplug are complicate, and it may affect the normal function of the machines.

Accordingly, how to provide an air shroud to solve the aforementioned problems becomes an important issue to be solved by those in the industry.

SUMMARY

The invention provides a detachable assembled air shroud.

According to an embodiment of the discourse, the assembled air shroud includes a first plate and a second plate. The first plate has a first engaging portion. The second plate has a second engaging portion facing the first engaging portion. The first plate and the second plate are arranged along a first axis, and the first engaging portion and the second engaging portion are detachably engaged along a second axis different from the first axis.

In an embodiment of the disclosure, one of the first engaging portion and the second engaging portion has a guiding groove extending along the second axis, another one of the first engaging portion and the second engaging portion has a protruding post, and the protruding post is configured to slide in the guiding groove along the second axis.

In an embodiment of the disclosure, the guiding groove has two opposite open ends along the second axis.

In an embodiment of the disclosure, the first engaging portion has a first side wall and a first hook, the second engaging portion has a second side wall and a second hook, the first side wall is engaged with the second hook, and the second side wall is engaged with the first hook.

In an embodiment of the disclosure, the first engaging portion has a first elastic wall connecting with the first side wall, the second engaging portion has a second elastic wall connecting with the second side wall, each of the first side wall and the second side wall has an upper edge and a lower edge, the first hook is located at a side of the first elastic wall away from the lower edge of the first side wall, and the second hook is located at a side of the second elastic wall away from the lower edge of the second side wall.

In an embodiment of the disclosure, the first hook protrudes from the first elastic wall toward the second plate along the first axis, the second hook protrudes from the second elastic wall toward the first plate along the first axis, the first elastic wall is configured to be forced and away from the second plate along the first axis, and the second elastic wall is configured to be forced and away from the first plate along the first axis.

In an embodiment of the disclosure, the first hook has a first abutting portion perpendicular to the first elastic wall, the second hook has a second abutting portion perpendicular to the second elastic wall, the upper edge of the first side wall is abutted against a bottom surface of the first abutting portion of the first hook, and the upper edge of the second side wall is abutted against a bottom surface of the second abutting portion of the second hook.

In an embodiment of the disclosure, a distance between the first abutting portion and the lower edge of the first side wall is equal to a distance between the upper edge of the second side wall and the lower edge of the second side wall, a distance between the second abutting portion and the lower edge of the second side wall is equal to a distance between the upper edge of the first side wall and the lower edge of the first side wall.

In an embodiment of the disclosure, the first hook has a first connection wall connecting with the first abutting portion and the first elastic wall, the second hook has a second connection wall connecting with the second abutting portion and the second elastic wall, a width of the first connection wall along the first axis increases as a distance between the first connection wall and the lower edge of the first side wall decreases, and the a width of the second connecting wall along the first axis increases as a distance between the second connecting wall and the lower edge of the second side wall decreases.

In an embodiment of the disclosure, each of the lower edges of the first side wall and the second side wall has a chamfer.

Accordingly, the first plate and the second plate of the assembled air shroud of the present disclosure may be assembled and disassembled through the first engaging portion and the second engaging portion. When users are going to exchange the electronic devices underlying the first plate (or the second plate), the cables can be moved above the second plate (or the first plate), and the electronic devices can be exchanged after disassembling the first plate from the second plate (or disassembling the second plate from the first plate). As such, there is no need to unplug the cables by the users to finish exchanging the electronic devices. Therefore, the assembled air shroud of the present disclosure can avoid complicated process of plug and unplug, thereby simplifying the process of exchanging the electronic devices while maintain the normal function of machines.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows:

FIGS. 5A to 5D are cross-sectional views of different stages during assembling the first plate onto the second plate;

DETAILED DESCRIPTION

Figure 1:
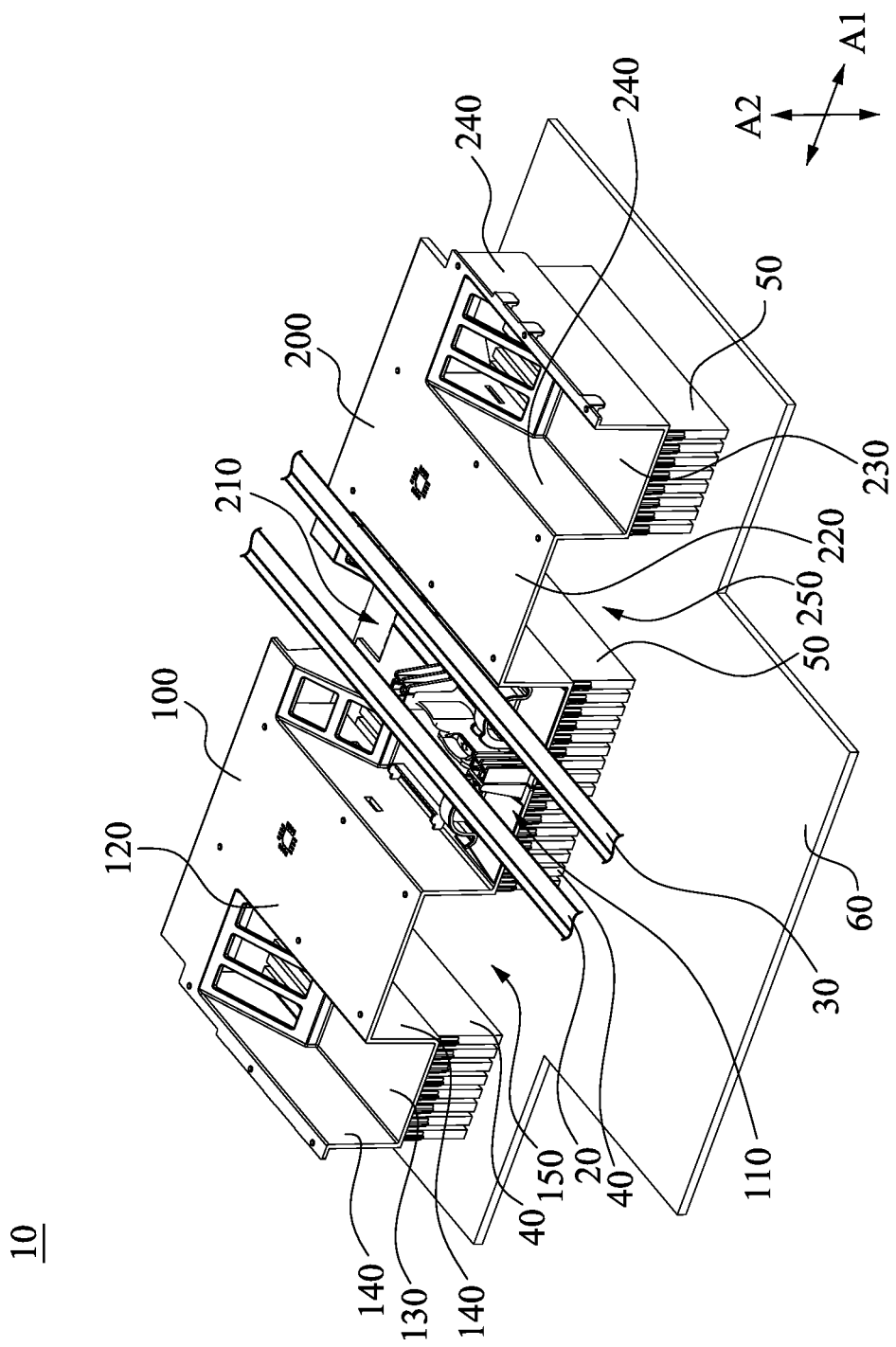
FIG. 1 is a perspective view of an assembled air shroud according to an embodiment of the disclosure.

Reference will now be made in detail to the present embodiments of the invention, examples of which are illustrated in the accompanying drawings. Wherever possible, the same reference numbers are used in the drawings and the description to refer to the same or like parts.

In addition, terms used in the specification and the claims generally have the usual meaning as each terms are used in the field, in the context of the disclosure and in the context of the particular content unless particularly specified. Some terms used to describe the disclosure are to be discussed below or elsewhere in the specification to provide additional guidance related to the description of the disclosure to specialists in the art.

Phrases "first," "second," etc., are solely used to separate the descriptions of elements or operations with same technical terms, not intended to be the meaning of order or to limit the invention.

Secondly, phrases "comprising," "includes," "provided," and the like, used in the context are all open-ended terms, i.e. including but not limited to.

Further, in the context, "a" and "the" can be generally referred to one or more unless the context particularly requires. It will be further understood that phrases "comprising," "includes," "provided," and the like, used in the context indicate the characterization, region, integer, step, operation, element and/or component it stated, but not exclude descriptions it stated or additional one or more other characterizations, regions, integers, steps, operations, elements, components and/or groups thereof.

Figure 2:
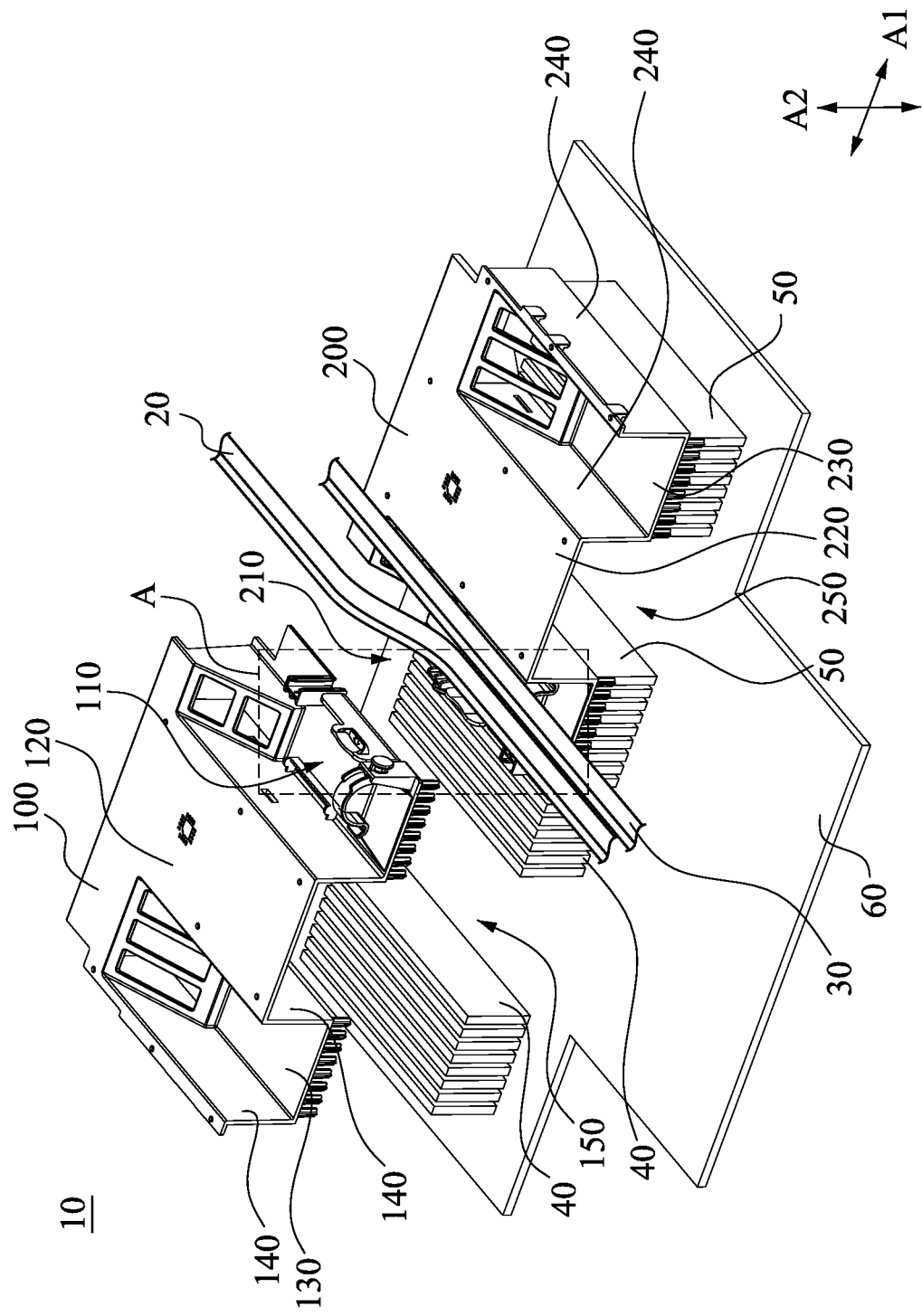
FIG. 2 is a perspective view of the assembled air shroud in FIG. 1, wherein the first plate and the second plate are separated.

Reference is made to FIG. 1 and FIG. 2. FIG. 1 is a perspective view of an assembled air shroud 10 according to an embodiment of the disclosure. FIG. 2 is a perspective view of the assembled air shroud 10 in FIG. 1, wherein the first plate 100 and the second plate 200 are separated. As shown in FIG. 1 and FIG. 2, the assembled air shroud 10 includes a first plate 100 and a second plate 200. The first plate 100 has a first engaging portion 110, and the second plate 200 has a second engaging portion 210 facing the first engaging portion 110. As shown in FIG. 1, the first plate 100 and the second plate 200 are arranged along a first axis A1, and are detachably engaged through the first engaging portion 110 and the second engaging portion 210. As shown in FIG. 2, the first plate 100 is disassembled and separated from the second plate 200 along a second axis A2 through the first engaging portion 110 and the second engaging portion 210. The second axis A2 is different from the first axis A1. In the present embodiment, the first axis A1 is perpendicular to the second axis A2, but the present invention is not limited in this regard.

As shown in FIG. 1 and FIG. 2, the assembled air shroud 10 is disposed upon a plurality of electronic devices 40, 50. Furthermore, cables 20, 30 are disposed above and across the assembled air shroud 10, and the cables 20, 30 are electrically connected to the board 60. For example, the first plate 100 is disposed over a plurality of electronic devices 40, and the cable 20 is disposed across the first plate 100. The second plate 200 is disposed over a plurality of electronic devices 50, and the cable 30 is disposed across the second plate 200. In the present embodiment, the electronic devices 40, 50 may be memory cards.

The first plate 100 has a top plate 120, a bottom plate 130, and side plates 140. The second plate 200 has a top plate 220, a bottom plate 230, and side plates 240. The top plate 120 and the bottom plate 130 of the first plate 100 are connected through the side plates 140, and the top plate 220 and the bottom plate 230 of the second plate 200 are connected through the side plates 240. Two sides of the top plate 120 are respectively connected with two side plates 140 to form an air channel 150, and the two sides of the top plate 220 are respectively connected with two side plates 240 to form an air channel 250. The bottom plates 130, 230 respectively cover the electronic devices 40, 50. The first engaging portion 110 and the second engaging portion 210 are respectively located at edges of two adjacent bottom plates 130, 230 of the first plate 100 and the second plate 200. When the first engaging portion 110 is engaged with the second engaging portion 210, the two plates 130, 230 where the first engaging portion 110 and the second engaging portion 210 are located can be stitched together.

Reference is made to FIG. 2, since the first plate 100 and the second plate 200 of the assembled air shroud 10 can be assembled or disassembled through the first engaging portion 110 and the second engaging portion 210. When users are going to exchange the electronic devices 40, the cables 20 can be moved above the second plate 200, and the electronic devices 40 can be exchanged after disassembling the first plate 100 from the second plate 200. Similarly, when users are going to exchange the electronic devices 50, the cables 30 can be moved above the first plate 100, and the electronic devices 50 can be exchanged after disassembling the second plate 200 from the first plate 100. As such, there is no need to unplug the cables 20, 30 by the users to finish exchanging the electronic devices 40, 50. Therefore, the structure design of the assembled air shroud 10 can avoid complicated process of plug and unplug, thereby simplifying the process of exchanging the electronic devices 40, 50 while maintain the normal function of machines. Detailed structures of the first engaging portion 110 and the second engaging portion 210 will be introduced to explain the assembling and disassembling processes of the first engaging portion 110 and the second engaging portion 210.

Figure 3:
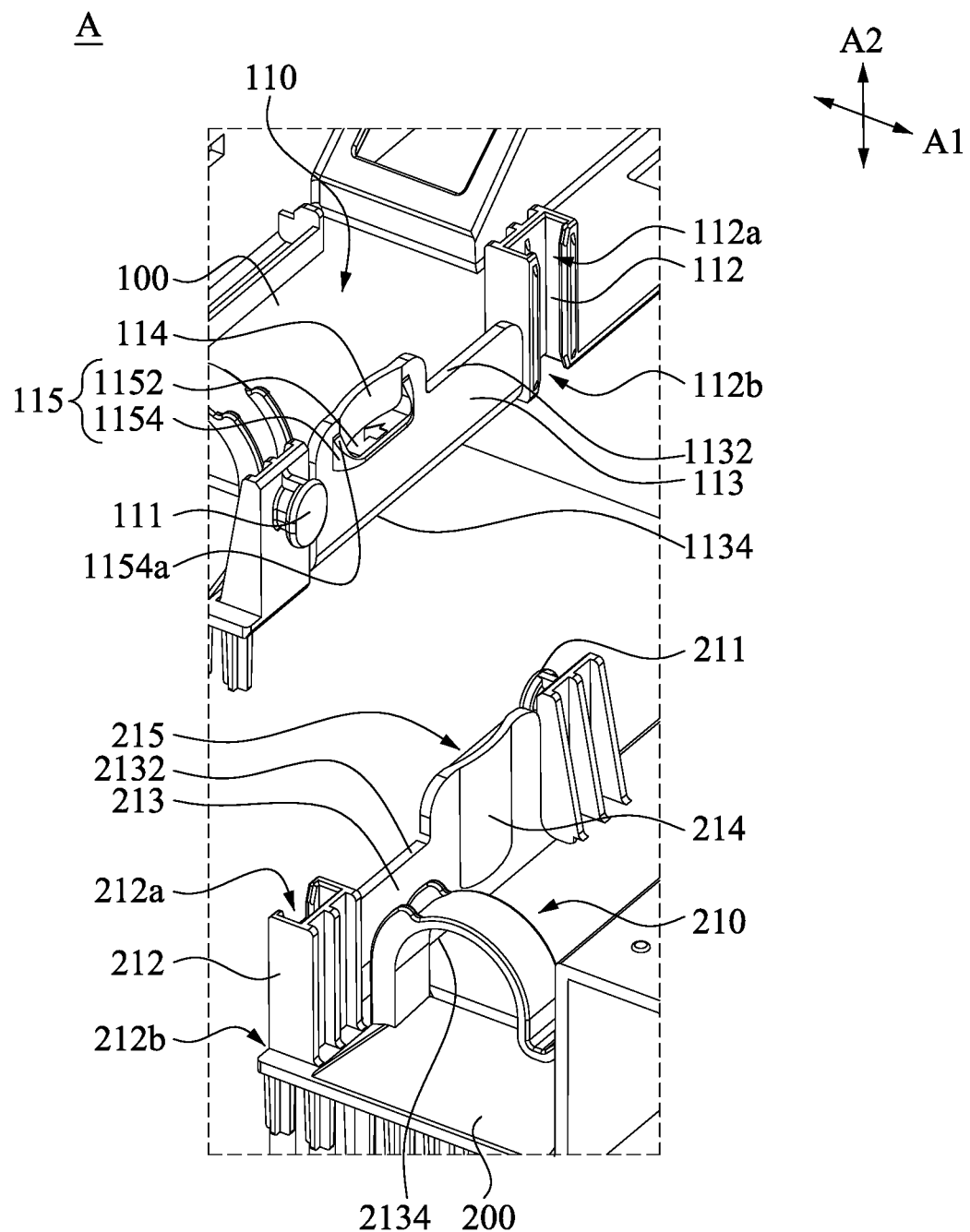
FIG. 3 is an enlarged view of the assembled air shroud in FIG. 2.
Figure 4:
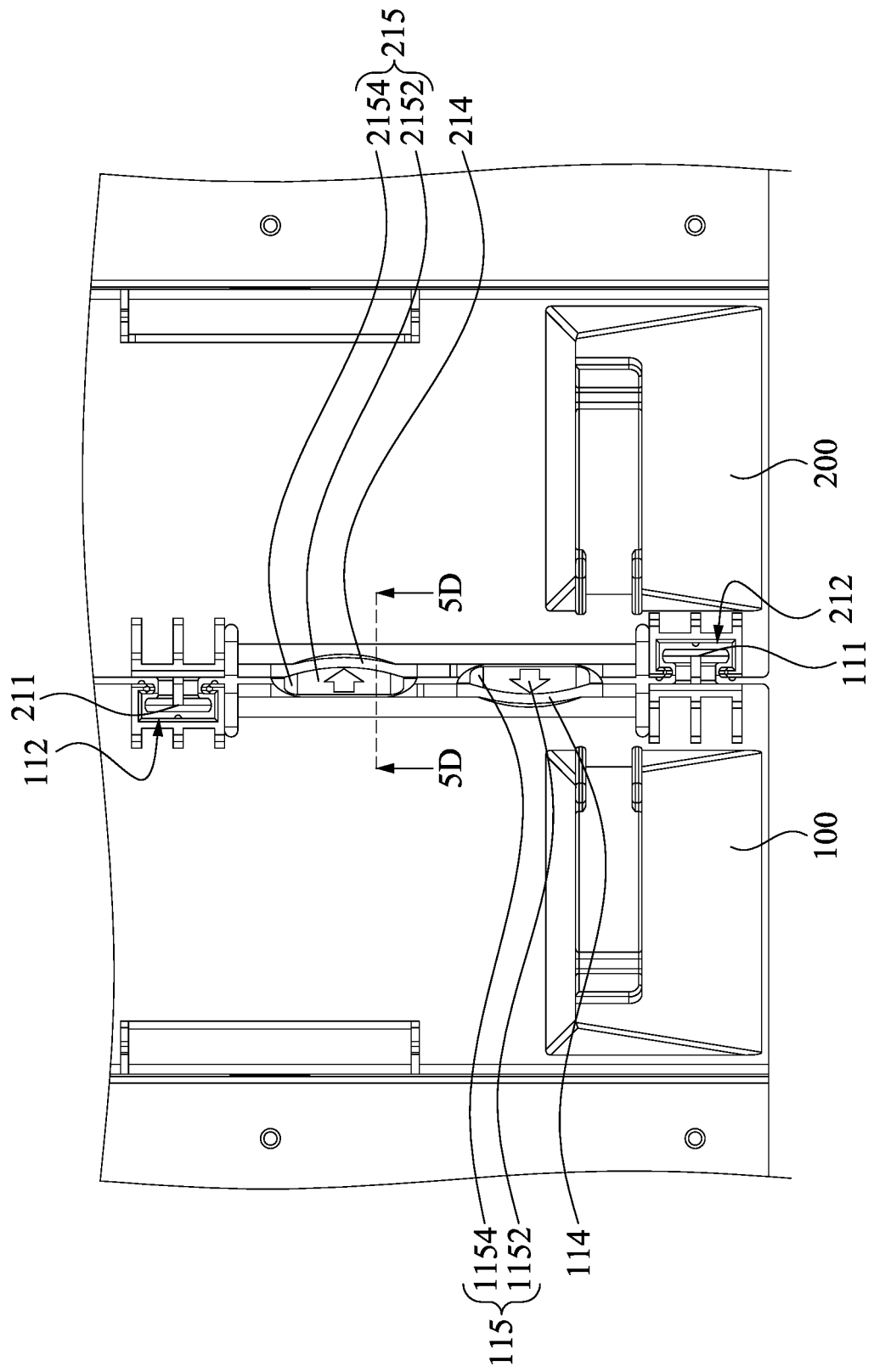
FIG. 4 is a partial top view of the assembled air shroud in FIG. 1.

Reference is made to FIG. 3 and FIG. 4. FIG. 3 is an enlarged view of the assembled air shroud 10 of the region A in the FIG. 2. FIG. 4 is a partial top view of the assembled air shroud 10 in FIG. 1. In the present embodiment, the first engaging portion 110 includes a protruding post 111 and a guiding groove 112, and the second engaging portion 210 includes a protruding post 211 and a guiding groove 212. In some embodiments, the first engaging portion 110 may include only the protruding post 111, but not the guiding groove 112. The second engaging portion 210 may include only the guiding groove 212, but not the protruding post 211. The present disclosure is not limited in this regard, as long as the first engaging portion 110 and the second engaging portion 210 respectively have a protruding post and a guiding groove mated with the protruding post.

In some embodiments, the guiding groove 112 and the guiding groove 212 extend along the second axis A2, and the guiding groove 112 and the guiding groove 212 respectively have two opposite open ends along the second axis A2. As shown in FIG. 3, the guiding groove 112 has an open end 112a located at the upper side in FIG. 3 and an open end 112b located at the lower side in FIG. 3. The guiding groove 212 has an open end 212a located at the upper side in FIG. 3 and an open end 212b located at the lower side in FIG. 3. The protruding post 111 of the first engaging portion 110 is configured to slide within the guiding groove 212 of the second engaging portion 210, and the protruding post 211 of the second engaging portion 210 is configured to slide within the guiding groove 112 of the first engaging portion 110.

Specifically, when assembling the first plate 100 onto the second plate 200, the protruding post 111 of the first engaging portion 110 may slide from the open end 212a of the guiding groove 212 and move toward another open end 212b. At the same time, the protruding post 211 of the second engaging portion 210 may slide from the open end 112b of the guiding groove 112 and move toward another open end 112a.

As shown in FIG. 4, when the first plate 100 and the second plate 200 are assembled, the guiding groove 212 partially surrounds the protruding post 111. Therefore, the guiding groove 212 of the second engaging portion 210 may constrain the movement of the protruding post 111 of the first engaging portion 110 along the first axis A1 away from the second plate 200. Similarly, the guiding groove 112 partially surrounds the protruding post 211. Therefore, the guiding groove 112 of the first engaging portion 110 may constrain the movement of the protruding post 211 of the second engaging portion 210 along the first axis A1 away from the first plate 100. In other word, the configuration between the guiding groove 112 and protruding post 211 and the configuration between the guiding groove 212 and protruding post 111 may fix the first plate 100 and the second plate 200 along the first axis A1.

Reference is made to FIG. 3, in the present embodiment, the first engaging portion 110 further includes a first side wall 113, a first elastic wall 114, and a first hook 115. The second engaging portion 210 further includes a second side wall 213, a second elastic wall 214, and a second hook 215. The first side wall 113 connects the first elastic wall 114, and the first hook 115 is located on the first elastic wall 114. The second side wall 213 connects the second elastic wall 214, and the second hook 215 is located on the second elastic wall 214. The first side wall 113 has an upper edge 1132 and a lower edge 1134 opposite to the upper edge 1132 along the second axis A2. The first hook 115 is located at a side of the first elastic wall 114 away from the lower edge 1134 of the first side wall 113. The second side wall 213 has an upper edge 2132 and a lower edge 2134 opposite to the upper edge 2132 along the second axis A2. The second hook 215 is located at a side of the second elastic wall 214 away from the lower edge 2134 of the second side wall 213. The first hook 115 protrudes from the first elastic wall 214 toward the second plate 200 along the first axis A1, and the second hook 215 correspondingly protrudes from the second elastic wall 214 toward the first plate 100 along the first axis A1.

Reference is made to FIG. 1 and FIG. 4, the first side wall 113 and the second hook 215 are configured to be mated and engaged with each other, the second side wall 213 and the first hook 115 are configured to be mated and engaged with each other, such that the first plate 100 and the second plate 200 are fixed along the second axis A2. Reference is made to FIG. 3, when disassembling the first plate 100 from the second plate 200, the first elastic wall 114 is configured to be forced and be elastically deformed, such that the first elastic wall 114 is away from the second plate 200 along the first axis A1 and the first hook 115 is detached from the second side wall 213. Sequentially, the protruding post 111 and the protruding post 211 respectively slide away from the guiding groove 112 and the guiding groove 212, such that the first plate 100 can be disassembled from the second plate 200. Similarly, when disassembling the second plate 200 from the first plate 100, the second elastic wall 214 is configured to be forced and be elastically deformed, such that the second elastic wall 214 is away from the first plate 100 along the first axis A1 and the second hook 215 is detached from the first side wall 113. Sequentially, the protruding post 111 and the protruding post 211 respectively slide away from the guiding groove 112 and the guiding groove 212, such that the second plate 200 can be disassembled from the first plate 100. The steps of applying force upon the first elastic wall 114 and the second elastic wall 214 to separate the first plate 100 and the second plate 200 will be described in detail in the following paragraphs.

Reference is made to FIG. 3, the first hook 115 further includes a first abutting portion 1152 perpendicular to the first elastic wall 114, and the first hook 115 includes a first connection wall 1154 connecting with the first abutting portion 1152 and the first elastic wall 114. The second hook 215 in the FIG. 3 has the same structure as the first hook 115. Therefore, the second hook 215 has a second abutting portion 2152 perpendicular to the second elastic wall 214, and the second hook 215 has a second connection wall 2154 (see FIG. 5A to FIG. 5D) connecting with the second abutting portion 2152 and the second elastic wall 214. In the present embodiment, the first connection wall 1154 and the second connection wall 2154 are triangular side wall. As shown in FIG. 3, a width of the first connection wall 1154 along the first axis A1 increases as a distance between the first connection wall 1154 and the lower edge 1134 of the first side wall 113 decreases. That is, the width of the first connection wall 1154 along the first axis A1 is gradually increased from top to bottom and form an incline 1154a. Similarly, a width of the second connecting wall 2154 along the first axis A1 increases as a distance between the second connecting wall 2154 and the lower edge 2134 of the second side wall 213 decreases. That is, the width of the second connecting wall 2154 is gradually increased from top to bottom and form an incline 2154a (see FIG. 5A to FIG. 5D).

Reference is made to FIG. 5A to FIG. 5D. FIGS. 5A to 5D are cross-sectional views of different stages during assembling the first plate 100 onto the second plate 200. FIG. 5D shows a cross-sectional view taken along the line 5D-5D in FIG. 4, and FIGS. 5A to 5C have the same cross-section positions. For simplicity, merely the first side wall 113 of the first engaging portion 110 and the second elastic wall 214 and the second hook 215 of the second engaging portion 210 are shown. Reference is made to FIG. 5A, when the first plate 100 is not yet assembled onto the second plate 200, the lower edge 1134 of the first side wall 113 is aligned with the second hook 215 located at the second connecting wall 2154, and the first plate 100 is move forward to the second plate 200.

Reference is made to FIG. 5B, in the present embodiment, the lower edge 1134 of the first side wall 113 has a chamfer 1136, and the lower edge 2134 of the second side wall 213 also has a chamfer 2136. When the first side wall 113 moves forward to the second hook 215, the lower edge 1134 of the first side wall 113 is in contact with the second hook 215 of the second connecting wall 2154. In other words, the chamfer 1136 of the first side wall 113 pushes the incline 2154a of the second connection wall 2154. As such, a push force F1 parallel to the first axis A1 is applied by the first side wall 113 onto the second hook 215 and the second elastic wall 214, and the second elastic wall 214 is forced and elastically deformed away from the first side wall 113 along the direction of the push force F1. Through the structure design of the chamfer 1136 and the incline 2154a, the assembling process of the first plate 100 and the second plate 200 can be smoother.

Reference is made to FIG. 5C, the first side wall 113 moves downward continuously. When the lower edge 1134 of the first side wall 113 has moved below the second abutting portion 2152 of the second hook 215, the second hook 215 and the second elastic wall 214 are continuously pushed by a surface of the first side wall 113 facing the second hook 215.

Reference is made to FIG. 5D, when the first plate 100 and the second plate 200 are assembled, the recovery force of the second side wall 214 will make the second hook 215 move toward the first side wall 113, and the second hook 215 may hook the first side wall 113. As shown in FIG. 5D, the upper edge 1132 of the first side wall 113 is abutted against a bottom surface of the second abutting portion 2152 of the second hook 215. At the same time, the first hook 115 may hook the second side wall 213, that is, the upper edge 2132 of the second side wall 213 is abutted against a bottom surface of the first abutting portion 1152 of the first hook 115 (see FIG. 3 and FIG. 4). As such, the second abutting portion 2152 may constrain the movement of the first engaging portion 110 along the second axis A2, and the first abutting portion 1152 may constrain the movement of the second engaging portion 210 along the second axis A2. Through the configuration design between the first side wall 113 and the second abutting portion 2152 and the configuration design between the second side wall 213 and the first abutting portion 1152, the first plate 100 and the second plate 200 can be fixed along the second axis A2.

Reference is made to FIG. 3 and FIG. 5D, in the present embodiment, when the first plate 100 and the second plate 200 are assembled, the bottom surface of the second abutting portion 2152 is parallel with the upper edge 1132 of the first side wall 113, and the bottom surface of the first abutting portion 1152 is parallel with the upper edge 2132 of the second side wall 213. The present disclosure is not limited in this regard, as long as the first engaging portion 110 and the second engaging portion 210 have a side wall and a hook that may be abutted against the side wall after the first plate 100 and the second plate 200 are assembled. In the present embodiment, after the first plate 100 and the second plate 200 are assembled, the upper edge 1132 of the first side wall 113 and the upper edge 2132 of the second side wall 213 have the same heights, but the present disclosure is not limited in this regard. In some embodiments, the first engaging portion 110 and the second engaging portion 210 are assembled as long as the side wall and the hook abutting against each other are located at the same height.

Reference is made to FIG. 3 and FIG. 5D, in the present embodiment, a distance between the first abutting portion 1152 and the lower edge 1134 of the first side wall 113 is equal to a distance between the upper edge 2132 of the second side wall 213 and the lower edge 2134 of the second side wall 213. A distance between the second abutting portion 2152 and the lower edge 2134 of the second side wall 213 is equal to a distance between the upper edge 1132 of the first side wall 113 and the lower edge 1134 of the first side wall 113. In other words, after the first plate 100 and the second plate 200 are assembled, the lower edge 1134 of the first side wall 113 is aligned with the lower edge 2134 of the second side wall 213, such that the bottom plate (see FIG. 1) stitched by the first plate 100 and the second plate 200 forms a continuous plane and prevents the underlying electronic elements 40, 50 from stress due to an uneven surface. The steps of assembling the second plate 200 onto the first plate 100 is similar to those described above, therefore, a description will not be repeated hereinafter.

Figure 6:
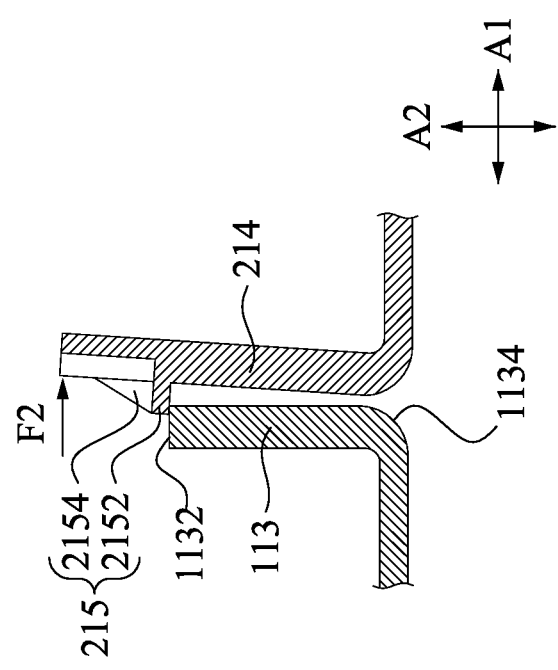
FIG. 6 is a cross-sectional view of an intermediate stage during disassembling the first plate from the second plate.

Reference is made to FIG. 6. FIG. 6 is a cross-sectional view of an intermediate stage during disassembling the first plate 100 from the second plate 200. When disassembling the first plate 100 from the second plate 200, a push force F2 may be applied on the second elastic wall 214, such that the second hook 214 may be elastically deformed and away from the first plate 100 along the first axis A1. After the second abutting portion 2152 is detached from the upper edge 1132 of the first side wall 113, the first plate 100 can be disassembled from the first plate 100. The steps of disassembling the second plate 200 from the first plate 100 is similar to those described above, therefore, a description will not be repeated hereinafter.

Figure 7:
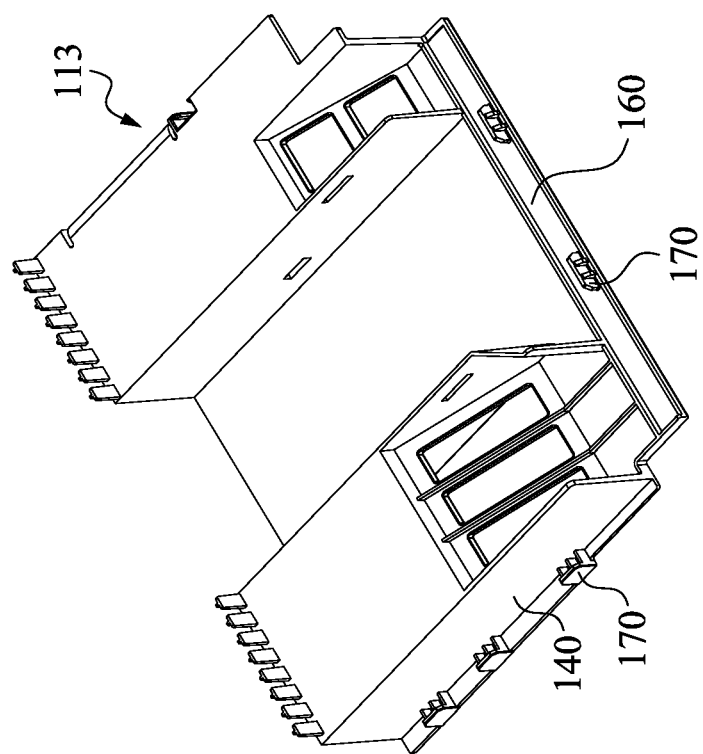
FIG. 7 is a perspective view from another sight of the first plate in FIG. 1.

Reference is made to FIG. 1 and FIG. 7. FIG. 7 is a perspective view from another sight of the first plate 100 in FIG. 1. As shown in FIG. 7, the first plate 100 further includes front plate 160 having ribs 170. The side plates 140 of the first plate 100 facing the first side wall 113 also have ribs 170. The ribs 170 are configured to catch the periphery elements (not shown), such as the housing. Therefore, a L-shaped supporting region may formed by the ribs 170. Furthermore, the second plate 200 also includes similar front plate and ribs as the first plate 100. As shown in FIG. 1, since the ribs 170 of the first plate 100 and the ribs of the second plate 200 may respectively form L-shaped supporting regions, the second plate 200 can still fixed relative to the periphery elements (not shown) through ribs after the first plate 100 is disassembled. Therefore, the cables 20, 30 may be supported to prevent electronic element 50 underlying the second plate 200 being damaged due to the weight of the cables 20, 30.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An assembled air shroud, comprising:
a first cover having a first engaging portion, wherein the first engaging portion has a first side wall, a first hook, and a first elastic wall connecting with the first side wall, the first side wall has an upper edge and a lower edge, the first hook is located at a side of the first elastic wall away from the lower edge of the first side wall, the first hook has a first abutting portion perpendicular to the first elastic wall, and the upper edge of the first side wall is abutted against a bottom surface of the first abutting portion of the first hook; and
a second cover having a second engaging portion facing the first engaging portion, wherein the first cover and the second cover are arranged sequentially on a first axis, and the first engaging portion and the second engaging portion are detachably engaged along a second axis different from the first axis, the second engaging portion has a second side wall, a second hook, and a second elastic wall connecting with the second side wall, the second side wall has an upper edge and a lower edge, the second hook is located at a side of the second elastic wall away from the lower edge of the second side wall, the second hook has a second abutting portion perpendicular to the second elastic wall, and the upper edge of the second side wall is abutted against a bottom surface of the second abutting portion of the second hook, and wherein the first side wall is engaged with the second hook, the second side wall is engaged with the first hook, a distance between the first abutting portion and the lower edge of the first side wall is equal to a distance between the upper edge of the second side wall and the lower edge of the second side wall, and a distance between the second abutting portion and the lower edge of the second side wall is equal to a distance between the upper edge of the first side wall and the lower edge of the first side wall.

2. The assembled air shroud of claim 1, wherein one of the first engaging portion and the second engaging portion has a guiding groove extending along the second axis, another one of the first engaging portion and the second engaging portion has a protruding post, and the protruding post is configured to slide in the guiding groove along the second axis.

3. The assembled air shroud of claim 2, wherein the guiding groove has two opposite open ends along the second axis.

4. The assembled air shroud of claim 1, wherein the first hook protrudes from the first elastic wall toward the second cover along the first axis, and the second hook protrudes from the second elastic wall toward the first cover along the first axis, the first elastic wall is configured to be forced and away from the second cover along the first axis, and the second elastic wall is configured to be forced and away from the first cover along the first axis.

5. The assembled air shroud of claim 1, wherein the first hook has a first connection wall connecting with the first abutting portion and the first elastic wall, the second hook has a second connection wall connecting with the second abutting portion and the second elastic wall, a width of the first connection wall along the first axis increases as a distance between the first connection wall and the lower edge of the first side wall decreases, and a width of the second connecting wall along the first axis increases as a distance between the second connecting wall and the lower edge of the second side wall decreases.

6. The assembled air shroud of claim 1, wherein each of the lower edges of the first side wall and the second side wall has a chamfer.

* * * * *